United States Patent [19]

Nagaya

[11] Patent Number: 5,045,906
[45] Date of Patent: Sep. 3, 1991

[54] SOLID STATE IMAGE PICKUP DEVICE HAVING PHOTO-SHIELD PLATE IN CONTACT WITH PHOTO-ELECTRIC CONVERTING REGION VIA SCHOTTKY BARRIER

[75] Inventor: Kazuhisa Nagaya, Tokyo, Japan
[73] Assignee: NEC Corporation, Tokyo, Japan
[21] Appl. No.: 559,035
[22] Filed: Jul. 30, 1990

[30] Foreign Application Priority Data

Jul. 28, 1989 [JP] Japan .................................. 1-196075

[51] Int. Cl.⁵ ........................ G11C 19/28; H01L 29/78
[52] U.S. Cl. ........................................ 357/24; 357/15; 357/30
[58] Field of Search ................ 357/24 LR, 24 M, 15, 357/30

[56] References Cited

U.S. PATENT DOCUMENTS 4,654,683  3/1987  Anagnostopoulos et al. .. 357/24 LR
4,977,584  12/1990  Kohno et al. .................. 357/24 LR

*Primary Examiner*—William D. Larkins
*Attorney, Agent, or Firm*—Sughrue, Mion, Zinn, Macpeak & Seas

[57] ABSTRACT

A solid state image pickup device is fabricated on a semiconductor substrate and comprises a well formed in a surface portion of the semiconductor substrate, photo-electric converting regions arranged in rows and columns and converting parts on an optical radiation into electric charges, respectively, charge transferring regions associated with the columns of the photo-electric converting regions, respectively, and conveying the electric charges, charge transferring electrodes provided over the charge transferring regions and allowing the charge transferring regions to convey the electric charges, and a metallic photo-shield plate preventing the charge transferring regions each being contiguous to the channel forming region from the optical radiation and exposing the photo-electric converting regions to the parts of the optical radiation, in which the metallic photo-shield plate is in contact with the photo-electric converting regions for forming Schottky barriers therebetween and excess electric charges flow into the metallic photo-shield plate over the Schottky barriers.

13 Claims, 9 Drawing Sheets $|dV1|<|dV|<|dV2|$

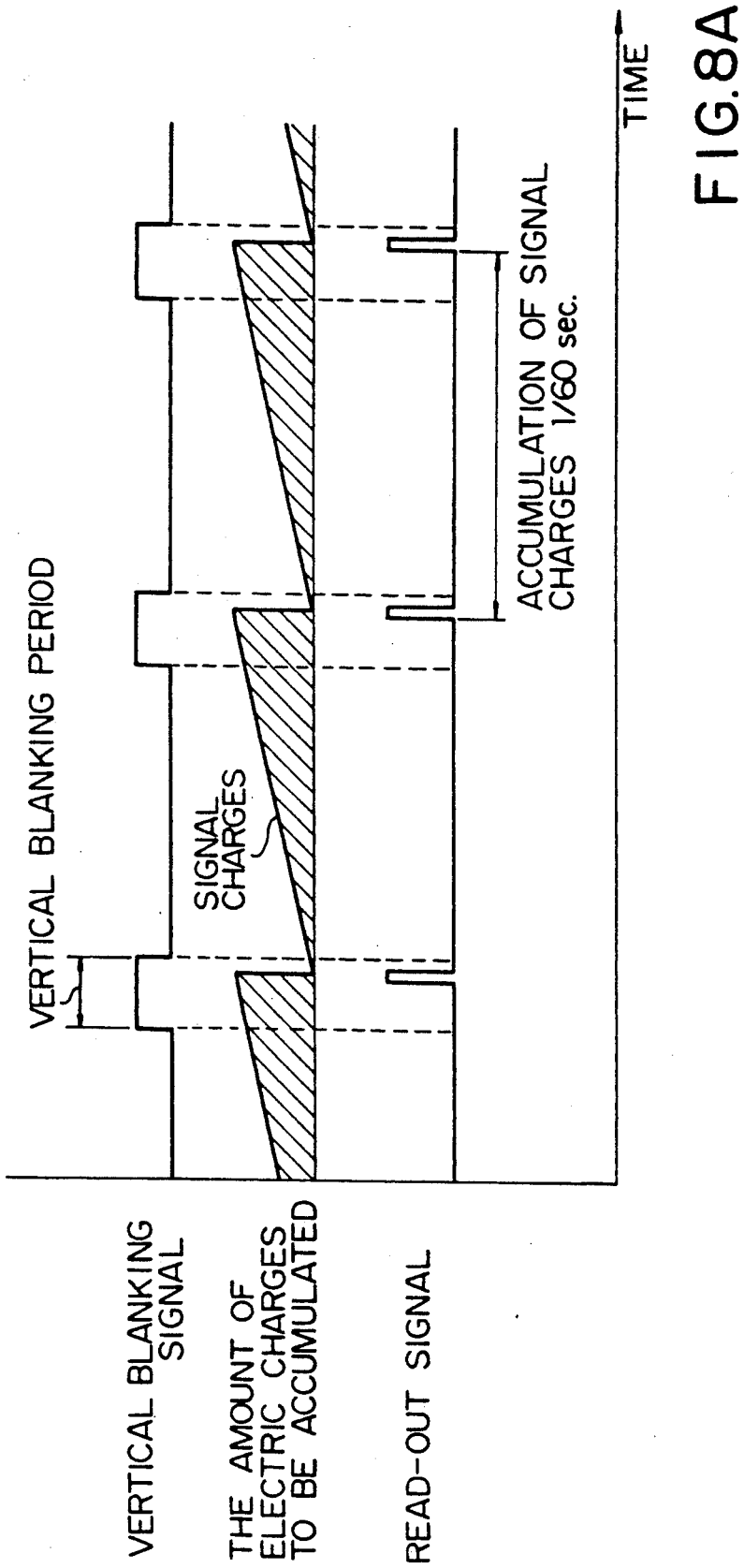

5,045,906

SOLID STATE IMAGE PICKUP DEVICE HAVING PHOTO-SHIELD PLATE IN CONTACT WITH PHOTO-ELECTRIC CONVERTING REGION VIA SCHOTTKY BARRIER

FIELD OF THE INVENTION

This invention relates to a solid state image pick up device and, more particularly, to a photo-shield plate not only preventing a charge transfer region from an optical radiation but also serving as a drain for excess electric charges.

DESCRIPTION OF THE RELATED ART

When an optical radiation with large luminous intensity is fallen onto a solid state image pickup device incorporated in an image displaying system, excess electric charges are produced in the array of photo-electric converting elements and are liable to overflow from the photo-electric converting elements into image signal propagating paths. These overflowing electric charges are causative of a false image carrying signal, and a blooming phenomenon takes place on a screen of an associated display unit. Various technologies have been proposed for restriction of the blooming phenomenon, and the prior art anti-blooming technologies were developed on the basis of the fact that the excess electric charges swept into a drain never produce the false image carrying signal. One of the prior art anti-blooming technology provides an overflow drain region formed in the vicinity of the array of the photo-electric converting elements, and a high frequency transferring pulse signal sweeps the excess electric charges into the overflow drain in a vertical blanking period. Another prior art anti-blooming technology forms a vertical overflow drain under the array of the photo-electric converting elements and removes a potential barrier between the photo-electric converting elements and a semiconductor substrate for sweeping the excess electric charges. Such a sweeping operation is known as "electronic shutter mode".

However, the overflow drain provided in the vicinity of the array occupies a substantial amount of real estate of the semiconductor substrate, and, for this reason, the first technology is less desirable for a large integration density of component elements.

The second technology using the vertical overflow drain is free from the drawback inherent in the above explained lateral overflow drain technology, because the vertical overflow drain is overlapped with the photo-electric converting elements and, therefore, no additional real estate is consumed by the vertical overflow drain. The vertical overflow drain is advantageous from the aspect of occupation area and have a majority in the solid state image pickup devices.

However, the vertical overflow drain structure needs a well provided between the photo-electric converting elements and the substrate, and the depth of the well directly concerns the amount of electric charges to be accumulated in the individual photo-electric converting elements. If irregularity takes place in the depth of the well, the photo-electric converting elements are dispersed in the accumulating capability, and this deteriorates the solid state image pickup device. For preventing the solid state image pickup device from deterioration, the formation process is strictly controlled so as to keep the depth constant. However, turbulences tend to take place in the formation process and deteriorates the production yield of the solid state image pickup device with the vertical overflow drain.

SUMMARY OF THE INVENTION

It is therefore an important object of the present invention to provide a solid state image pickup device which is resistive against a blooming phenomenon.

It is also an important object of the present invention to provide a solid state image pickup device the structure of which is relatively easy for fabrication and desirable for a large integration density.

To accomplish these objects, the present invention proposes to sweep excess electric charges to a metallic photo-shield plate over Schottky barriers.

In accordance with the present invention, there is provided a solid state image pickup device fabricated on a semiconductor substrate of a first conductivity type, comprising: a) a well having a second conductivity type opposite to the first conductivity type and formed in a surface portion of the semiconductor substrate; b) a plurality of photo-electric converting regions of the first conductivity type arranged in at least one line and converting parts of an optical radiation into electric charges; c) a plurality of charge transferring regions of the first conductivity type associated with the line of the photo-electric converting regions, respectively, and conveying the electric charges, each of the charge transferring regions being spaced apart from the associated line of the photo-electric converting regions by a channel forming region; d) charge transferring means provided over the charge transferring regions and allowing the charge transferring regions to convey the electric charges; and e) a metallic photo-shield plate preventing the charge transfer ring regions each being contiguous to the channel forming region from the optical radiation and exposing the photoelectric converting regions to the parts of the optical radiation, in which the metallic photo-shield plate is in contact with the photo-electric converting regions for forming Schottky barriers therebetween and in which excess electric charges overflow beyond the Schottky barrier into the metallic photo-shield plate.

BRIEF DESCRIPTION OF THE DRAWINGS

The features and advantages of a solid state image pickup device according to the present invention will be more clearly understood from the following description taken in conjunction with the accompanying drawings in which:

FIG. 8A is a timing chart showing an ordinary operational sequence of the solid state image pickup device shown in FIG. 1;

DESCRIPTION OF THE PREFERRED EMBODIMENTS

First Embodiment

Figure 1:
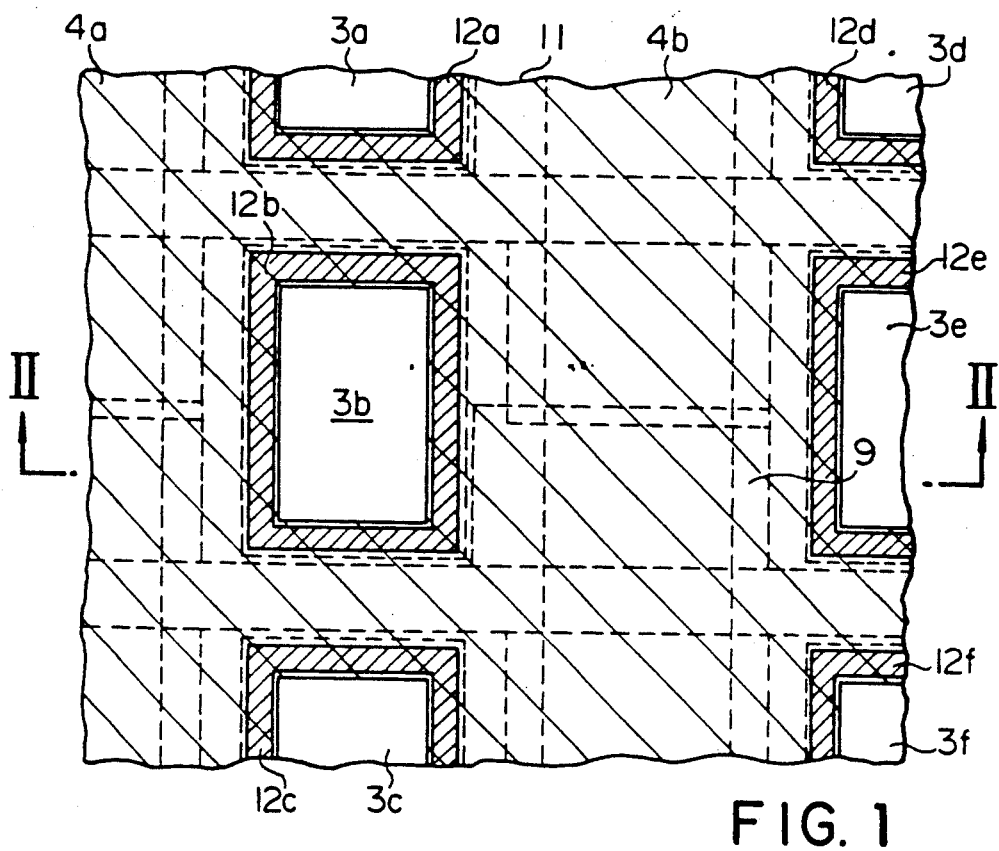
FIG. 1 is a plan view showing a part of a solid state image pickup device according to the present invention.
Figure 2:
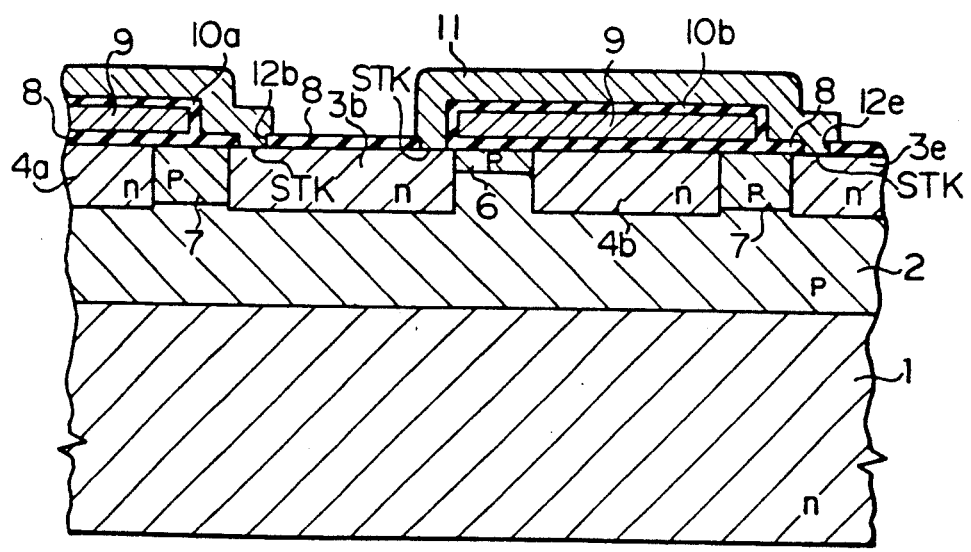
FIG. 2 is a cross sectional view taken along line II—II and showing the structure of the solid state image pickup device.

Referring to FIGS. 1 and 2 of the drawings, a solid state image pickup device embodying the present invention is fabricated on an n-type semiconductor substrate 1, and a p-type well region 2 is formed in the surface portion of the semiconductor substrate 1. In the surface portion of the p-type well region 2 are formed n-type photo-electric converting regions 3a 3b, 3c, 3d, 3e and 3f and charge transferring regions 4a and 4b at spacings. In this instance, the n-type impurity atoms of the photo-electric converting regions 3a to 3f ranges from about $10^{15}$ cm$^{-3}$ to about $10^{16}$ cm$^{-3}$. Each of the photo-electric converting regions 3a to 3f converts a part of an optical radiation and produces electric charges. The amount of electric charges depends on the luminous intensity of the part of the optical radiation, and, therefore, images carried on the optical radiation are converted into a distribution pattern of electric charges by the photo-electric converting regions 3a to 3f. The n-type photo-electric converting regions 3a to 3f are arranged in rows and columns, and the columns of the photo-electric converting regions 3a to 3f are respectively associated with the charge transferring regions 4a and 4b. Namely, the column of the photo-electric converting regions 3a to 3c are associated with the charge transferring region 4b, and the column of the photo-electric converting regions 3d to 3f are associated with another charge converting region (not shown) located on the right side thereof. The charge transferring region 4a is provided for another column of photo-electric converting regions (not shown) on the left side thereof.

Between the column of the photo-electric converting regions 3a to 3c and the charge transferring region 4b is formed a p-type transfer channel region 6 in which a conductive channel takes place for allowing the electric charges to flow from the photo-electric converting regions 3a to 3c to the charge transferring region 4b. The photoelectric converting regions 3a to 3c, the charge transferring region 4b and the transfer channel region 6 are surrounded by a heavily doped p-type channel stopper region 7, and the heavily-doped p-type channel stopper region 7 isolates the photo-electric converting regions 3a to 3c from one another as well as the column of the photo-electric converting regions 3a to 3c and the charge transferring region 4b from other component regions. The other columns of the photo-electric converting regions and the charge transferring regions are arranged in a similar manner to the photo-electric converting regions 3a to 3c associated with the charge transferring region 4b; however, no further description is incorporated for avoiding repetition.

The surface of the p-type well region 2 is covered with a thin insulating film 8 which is transparent to the optical radiation. Gate electrodes including a gate electrode 9 are formed over the charge transferring regions 4a and 4b to form a charge transfer shift register and the transfer channel region 6 to form a transfer channel, and a multi-phase vertical driving signal is applied to the gate electrodes so that the charge transferring regions 4a and 4b convey the electric charges read out from the associated columns of the photo-electric converting regions, respectively. The gate electrodes including the electrode 9 serve as charge transferring means. The gate electrodes are covered with thin insulating films such as films 10a and 10b, and the thin insulating films 10a and 10b and the surface portion of the p-type well region 2 are further covered with an aluminum photo-shield plate 11 except for the photo-electric converting regions 3a to 3f. In the thin insulating film 8 are formed a plurality of frameshaped contact windows which allows the aluminum photoshield plate 11 to be in contact with the photo-electric converting regions 3a to 3f. For better understanding, the frame-shaped contact windows 12a to 12f are hatched at narrow spacings, and the aluminum photo-shield plate 11 is indicated by hatching lines at wide spacings in FIG. 1.

As will be understood from FIG. 1, the aluminum photo-shield plate 11 exposes the portions of the thin insulating film 8 over the photo-electric converting regions 3a to 3f to the optical radiation, and the parts of the optical radiation penetrate the respective portions of the thin insulating film 8, thereby reaching the photoelectric converting regions 3a to 3f, respectively. However, the aluminum photo-shield plate 11 prevents the charge transferring regions 4a and 4b as well as the transfer channel regions such as the region 6 from the optical radiation.

Figure 3:
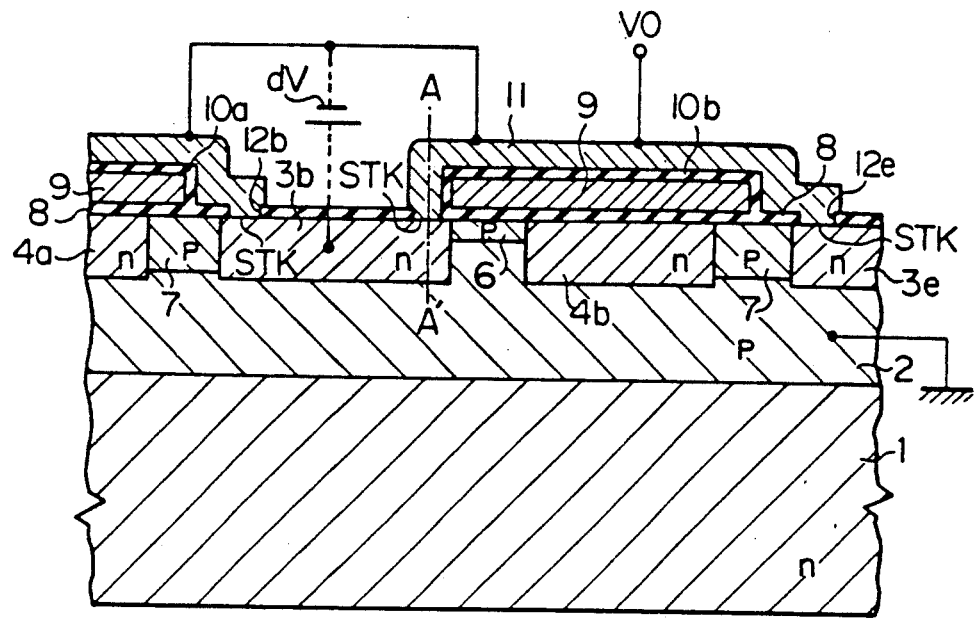
FIG. 3 is a cross sectional view showing the biasing conditions of the solid state image pickup device shown in FIG. 2.
Figure 4:
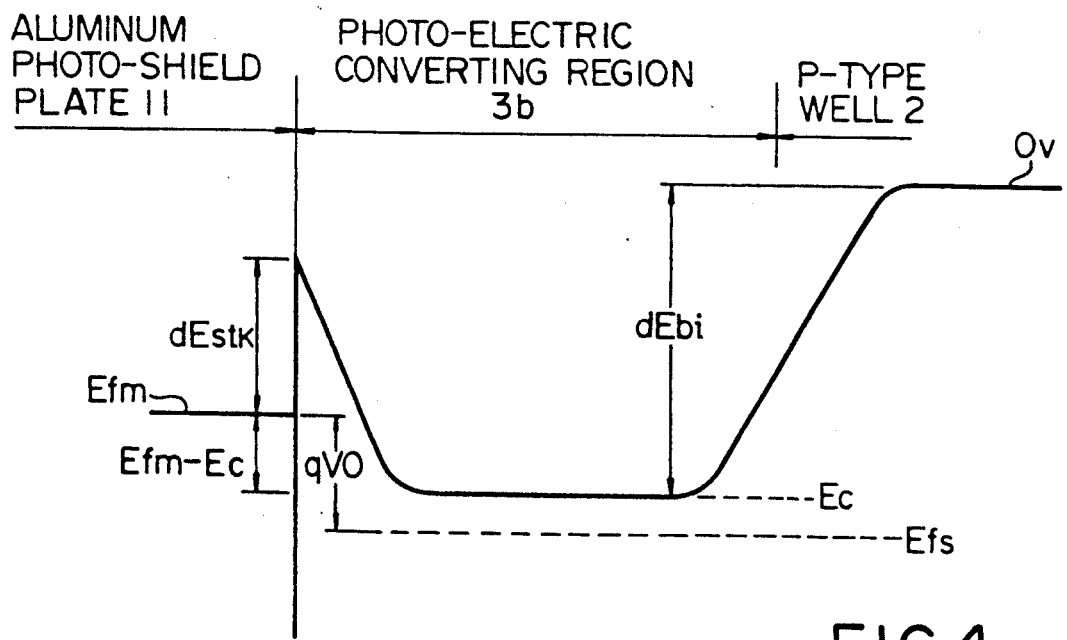
FIG. 4 is a diagram showing the bottom edge of a conduction band taken along line A-A' of FIG. 3.

As described in conjunction with the photo-electric converting regions 3a to 3f, the n-type impurity atoms range between about $10^{15}$ cm$^{-3}$ and about $10^{16}$ cm$^{-3}$. Schottky barriers take place at respective contacts STK between the photo-electric converting regions 3a to 3f and the aluminum photo-shield plate 11, and the Schottky barriers allow excess electric charges to flow thereover. In operation, the p-type well region 2 is grounded, and a predetermined voltage level V0 is applied to the aluminum photoshield plate 11 as shown in FIG. 3. If the aluminum photo-shield plate 11 is negatively biased by dV with respect to the photo-electric converting region 3b, the bottom edge of the conduction band along line A-A' is expressed as shown in FIG. 4. Efm and Efs stand for the Fermi level of aluminum and the Fermi level of the semiconductor material, respectively, and the Schottky barrier is as high as dEstk. Since the p-n junction between the photo-electric converting region 3b and the p-type well region 2 is reversely biased, a build-in potential dEbi takes place at the p-n junction. The n-type photo-electric converting region 3b and the p-type well region 2 are doped in such a manner as to satisfy the following relationship.

$$dEbi > dEstk + (Efm - Ec)$$

where Ec is the bottom edge of the conduction band of the photo-electric converting region 3b.

Figure 5:
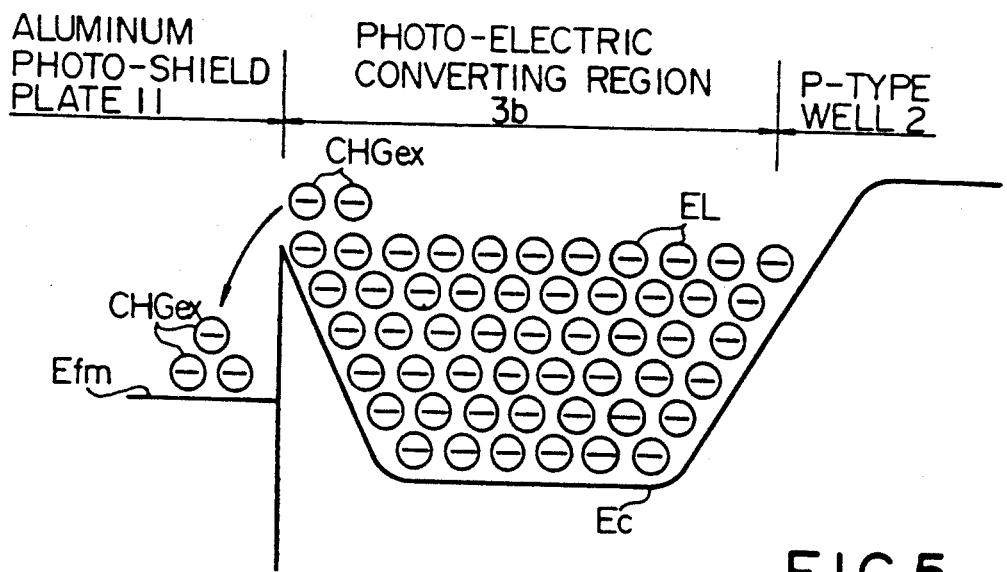
FIG. 5 is a view showing excess electric charges overflowing the Schottky barrier produced between a metallic photo-shield plate and a photo-electric converting region.

Under those biasing conditions, if a part of an optical radiation is fallen onto the photo-electric converting region 3b, the potential well between the Schottky barrier and the built-in potential is filled with electric charges produced through the photo-electric converting phenomenon. If the luminous intensity is within a regular range, no overflow takes place, and the electric charges are transferred to the charge transferring region 4b as an image carrying signal. However, if the luminous intensity exceeds a predetermined upper bound level, the electric charges overflow from the potential well as shown in FIG. 5, and excess electric charges CHGex flow beyond the Schottky barrier into the aluminum photo-shield plate 11. As will be understood from the above inequality, the built-in potential is higher than the Schottky barrier in terms of the electric charges accumulated in the photo-electric converting region 3b, and, for this reason, no excess electric charges overflows into the p-type well region 2.

Figure 6:
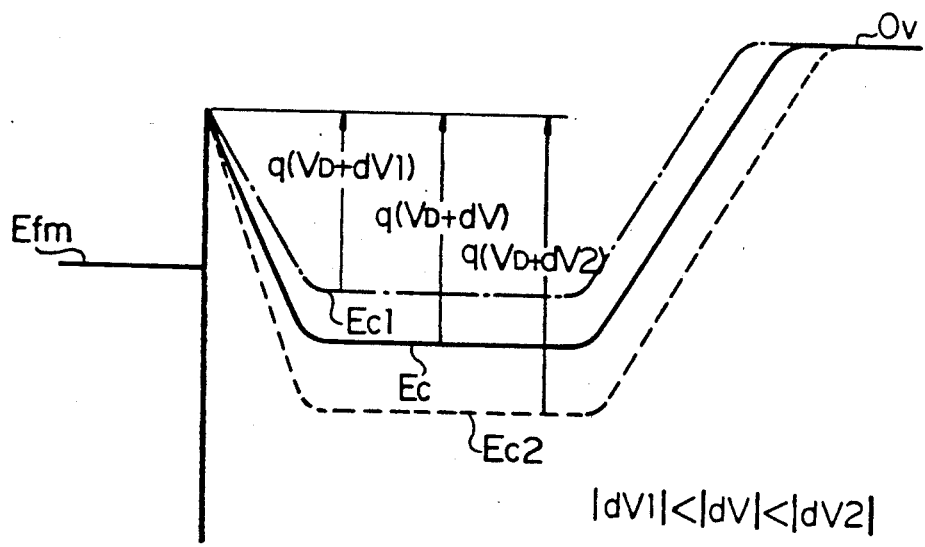
FIG. 6 is a diagram showing variations of the bottom edge of the conduction band in the photo-electric converting region taken along line A-A' under various biasing conditions.

FIG. 6 shows the bottom edge of the conduction band on the assumption that the photo-shield plate 11 is negatively biased by dV with respect to the photo-electric converting region 3b. If the difference in voltage level between the photo-shield plate 11 and the photo-electric converting region 3b is decreased to dV1, the bottom edge of the conduction band is upwardly moved from Ec to Ec1, and the potential well shallows by q(dV−dV1). The amount of electric charges to be accumulated is, accordingly, decreased. On the other hand, if the difference in voltage level is increased from dV to dV2, the bottom edge of the conduction band is downwardly moved from the Ec to Ec2, and, accordingly, the amount of electric charges to be accumulated is increased as shown in FIG. 6 where $V_D$ is a diffusion potential in the photo-electric converting region 3b. This means that the amount of electric charges to be accumulated in the potential well is variable with the voltage level V0 applied to the aluminum photo-shield plate 11. Thus, the solid state image pickup device according to the present invention can regulate the amount of electric charges to be accumulated by changing the voltage level at the aluminum photo-shield plate 11, and no delicate process control is necessary for formation of the p-type well region 2. This results in that the solid state image pickup device according to the present invention is easy for fabrication without sacrifice of the production yield.

Figure 7:
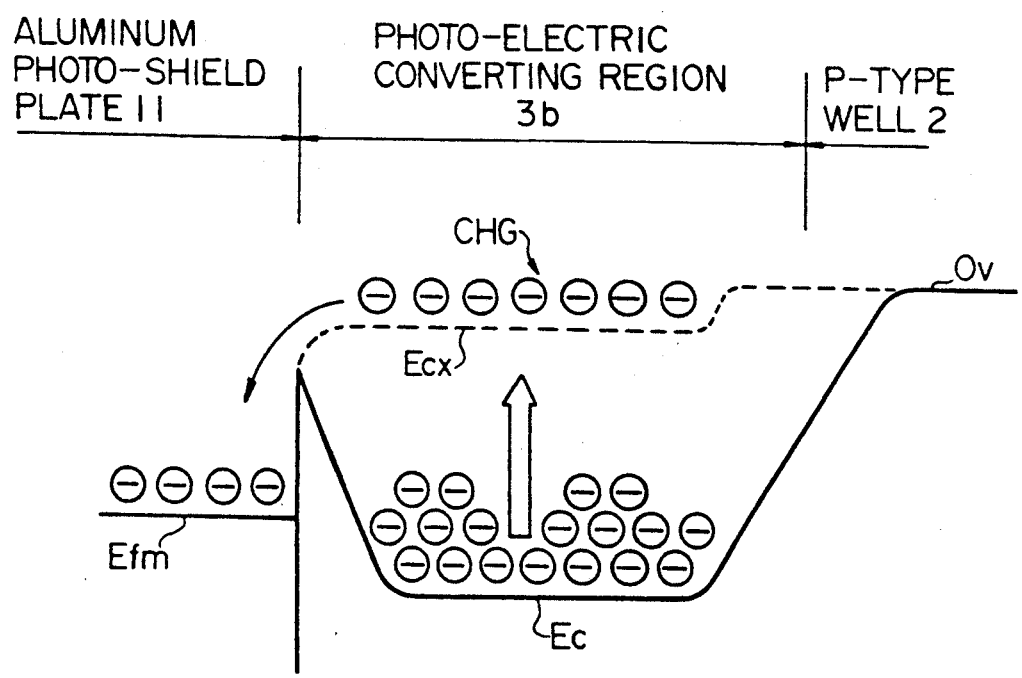
FIG. 7 is a diagram showing the bottom edge of the conduction band in the photo-electric converting region in an accumulating mode of operation and an electronic shutter mode of operation.

Since the amount of the electric charges to be accumulated in the potential well is varied with the voltage level V0 at the aluminum photo-shield plate 11, an electronic shutter mode of operation is achieved by changing the voltage level V0. In detail, the bottom edge Ec of the conduction band is indicated by the real line in FIG. 7 as long as the aluminum photo-shield plate 11 is negatively biased by dV; however, when the aluminum photo-shield plate 11 is positively biased with respect to the photo-electric converting region 3b and the difference in voltage level therebetween is assumed to be about 15 volts by way of example, the bottom edge of the conduction band exceeds the Schottky barrier, and the bottom edge Ecx thus lifted sweeps electric charges CHG into the aluminum photo-shield plate 11. Description is made on two different operational sequences with reference to FIGS. 8A and 8B. In the description, "signal charges" are used for electric charges produced in an accumulating mode of operation in the presence of an optical radiation within a regular range, and "ineffectual electric charges" means electric charges accumulated out of the accumulating mode of operation.

If the solid state image pickup device according to the present invention is used in an ordinary operational sequence where an accumulation of electric charges is immediately followed by a read-out of the electric charges as shown in FIG. 8A. In the ordinary operational sequence, a vertical blanking signal periodically defines vertical blanking periods, and a read-out signal of an active level is supplied to the gate electrode 9 in every vertical blanking period. In this instance, the accumulation of electric charges are carried out over a sixtieth between two read-out signals, and the electric charges to be accumulated are read out from the photo-electric converting region 3b through the transfer channel region 6 to the charge transferring region 4b in the presence of the readout signal. Then, all of the electric charges serves as the signal charges, and this operational sequence is less desirable for a high speed moving object, because the images to be reproduced on a screen is liable to be vague.

Figure 8B:
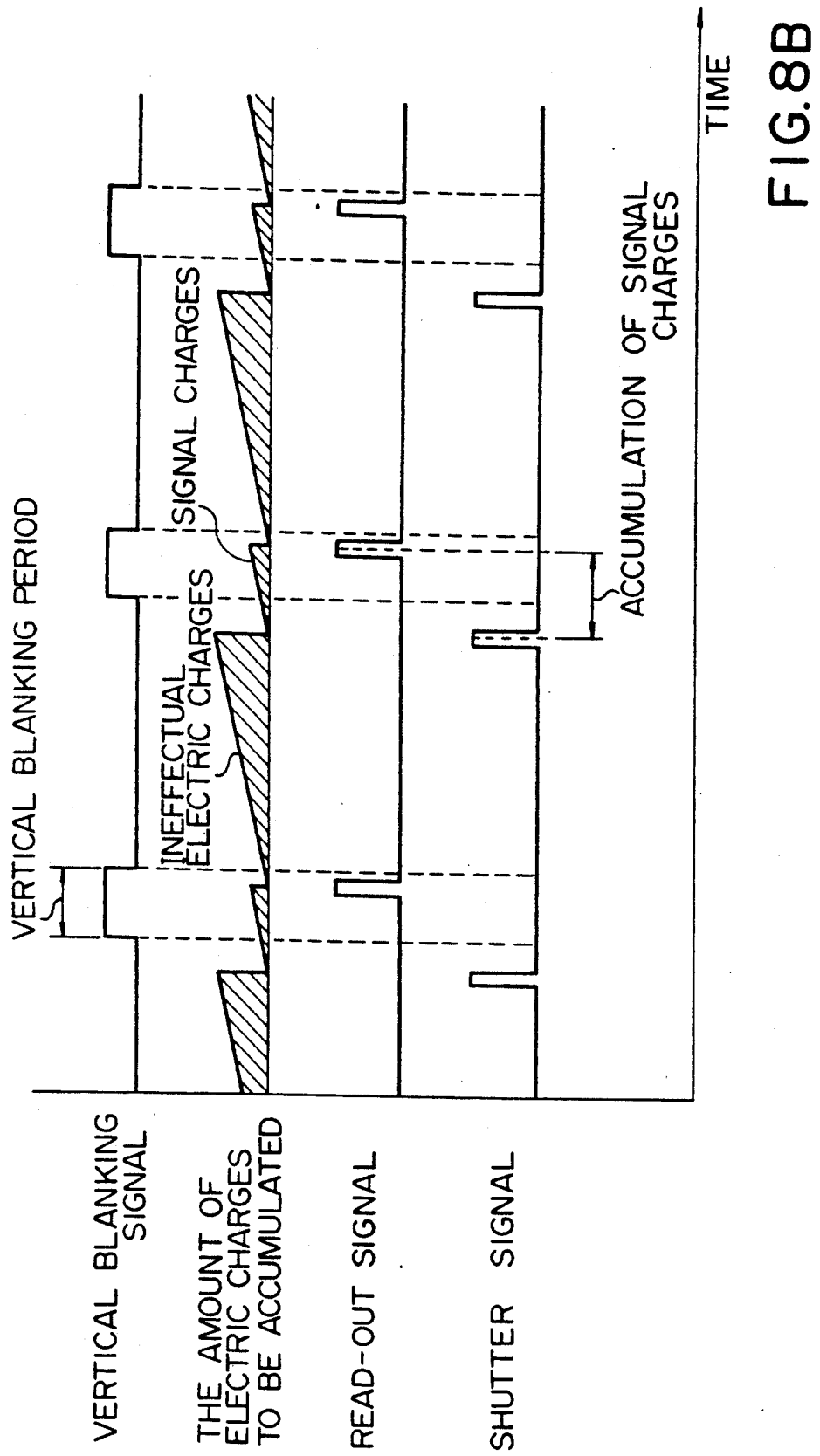
FIG. 8B is a timing chart showing another operational sequence where an electronic mode of operation is followed by an accumulating mode of operation.

If another operational sequence shown in FIG. 8B is established in the solid state image pickup device according to the present invention, the solid state image pickup device clearly catches images of a high speed moving object through an electronic shutter mode of operation. In the operational sequence shown in FIG. 8B, the vertical blanking signal periodically defines vertical blanking periods as similar to the ordinary operational sequence; however, a shutter signal is applied to the aluminum photo-shield plate 11 at a predetermined timing before every vertical blanking period, and a read-out signal is applied to the gate electrode 9 in the later stage of every vertical blanking period. In this instance, the shutter signal causes a difference in voltage level of about 15 volts to take place between the aluminum photo-shield plate 11 and the photo-electric converting regions including the region 3b. After the application of the read-out signal, electric charges are accumulated in the photo-electric converting region 3b but swept in the aluminum photo-shield plate 11 in the presence of the shutter signal. This means that the electric charges accumulated between the previous read-out signal and a shutter signal are rejected as the ineffectual electric charges. After the application of the shutter signal, the photo-electric converting region 3b starts accumulating electric charges, and the electric charges are read out to the charge transferring region 4b in the presence of the subsequent read-out signal. Thus, the signal charges are accumulated between the shutter signal and the subsequent read-out signal only, and, for this reason, the images to be reproduced on a screen is clear even if the images are taken from a high speed moving object. Since the shutter signal is applied at any timing between two read-out signals, a variable electronic shutter mode of operation is easily established. In the above mentioned example, the photo-shield plate 11 is supplied with about 5 volts; however, if the voltage level at the photo-shield plate 11 is varied in a predetermined range such as, for example, from 1 volt to 7 volts, the amount of charges to be accumulated is adjustable to a target level.

Second Embodiment

Figure 9:
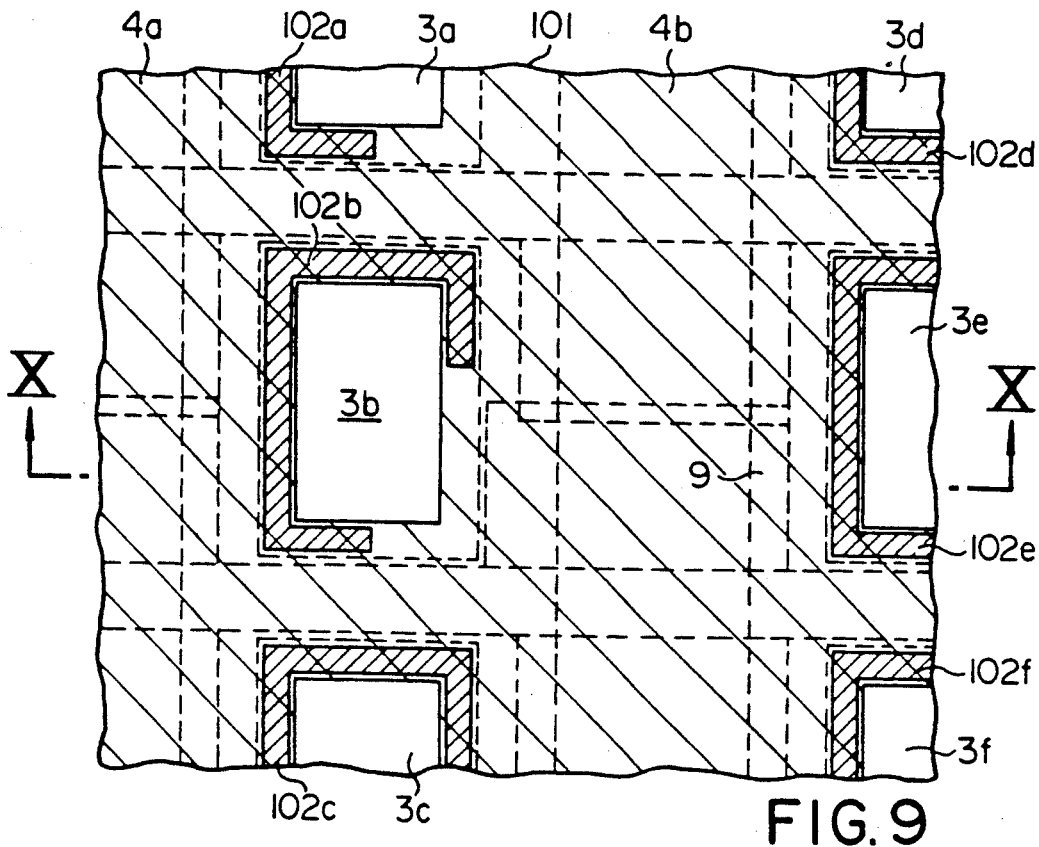
FIG. 9 is a plan view showing another solid state image pickup device according to the present invention.
Figure 10:
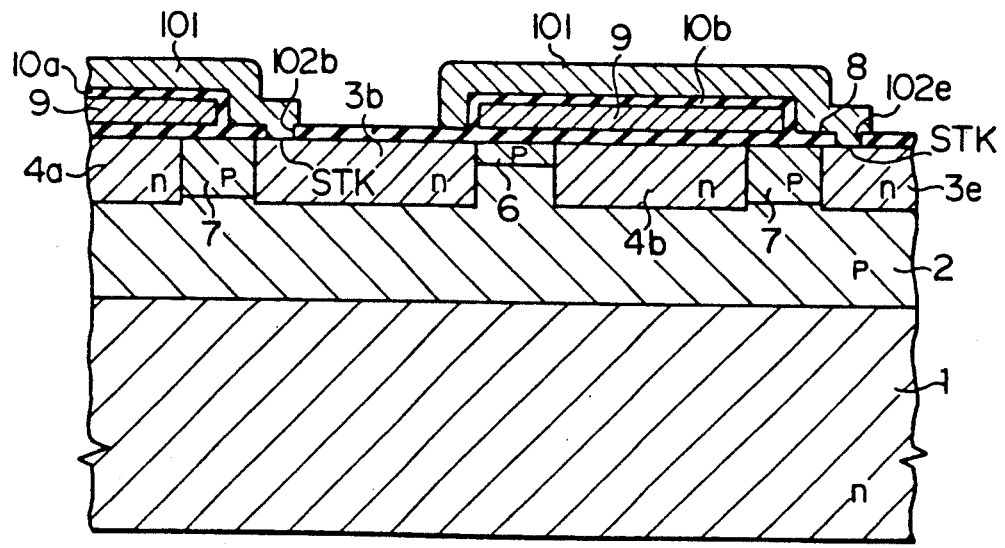
FIG. 10 is a cross sectional view taken along line X—X of FIG. 9 and showing the structure of the solid state image pickup device.

Turning to FIGS. 9 and 10 of the drawings, another solid state image pickup device embodying the present invention is illustrated. The solid state image pickup device shown in FIGS. 9 and 10 is similar in arrangement to that shown in FIGS. 1 and 2 except for an aluminum photoshield plate 101 and contact windows 102a to 102f, and, for this reason, other regions and films are denoted by reference numerals designating the corresponding parts of the first embodiment. The contact windows 102a to 102f are formed in the thin insulating film 8 and allow the aluminum photo-shield plate to be brought into contact with a part of a periphery of each of the photo-electric converting regions 3a to 3f. For better understanding, the aluminum photo-shield plate 101 is hatched at wide spacings, and the contact windows 102a to 102f are indicated by narrow hatching lines. In this instance, each of the contact windows 102a to 102f exposes most of the periphery, but the contact windows 102a to 102f may be decreased in area in another instance. The behavior of the solid state image pickup device shown in FIGS. 9 and 10 is similar in both operational sequences to that of the first embodiment, and no description is incorporated for avoiding repetition.

Third Embodiment

Figure 11:
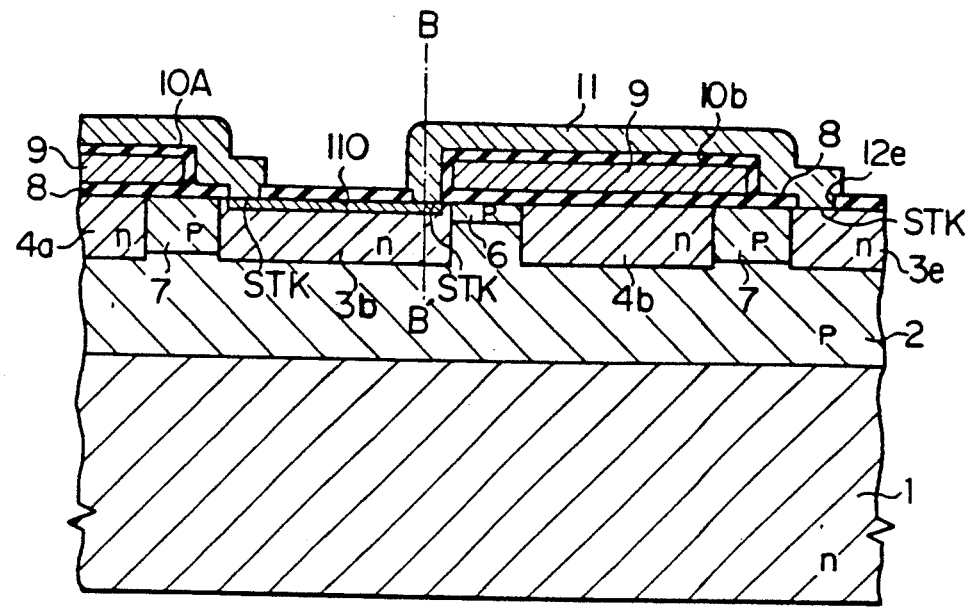
FIG. 11 is a cross sectional view showing the structure of still another solid state image pickup device according to the present invention.
Figure 12:
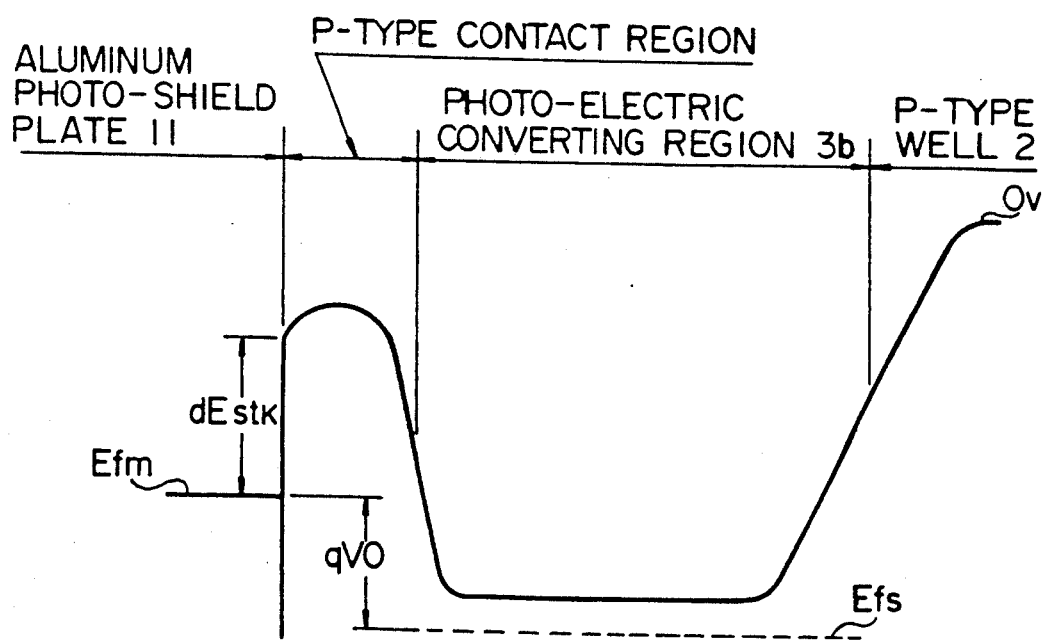
FIG. 12 is a diagram showing a bottom edge of a conduction band taken along line B-B' of FIG. 11.

Turning to FIG. 11 of the drawings, another solid state image pickup device embodying the present invention is fabricated on an n-type semiconductor substrate 1. The solid state image pickup device shown in FIG. 11 is similar to the first embodiment with the exception of a p-type spacer region 110 formed in a surface portion of each of the photo-electric converting regions such as the region 3b. Other component regions and films are designated by the same reference numerals used in FIG. 2 without any detailed description. The bottom edge of a conduction band taken along line B-B' is illustrated in FIG. 12. The p-type spacer region 110 is isolated from the p-type well region 2, and the p-type spacer region 110 physically separates the photo-electric converting region 3b from the boundary between the insulating film 8 and the semiconductor region. Dark current tends to takes place at the boundary, and the p-type spacer region 110 prevents the photo-electric converting region 3b from the dark current. This results in a solid state image pickup device free from the dark current.

The behavior of the solid state image pickup device shown in FIG. 11 is similar in both operational sequences to the first embodiment, and description on the behavior is omitted from the specification.

Fourth Embodiment

Figure 13:
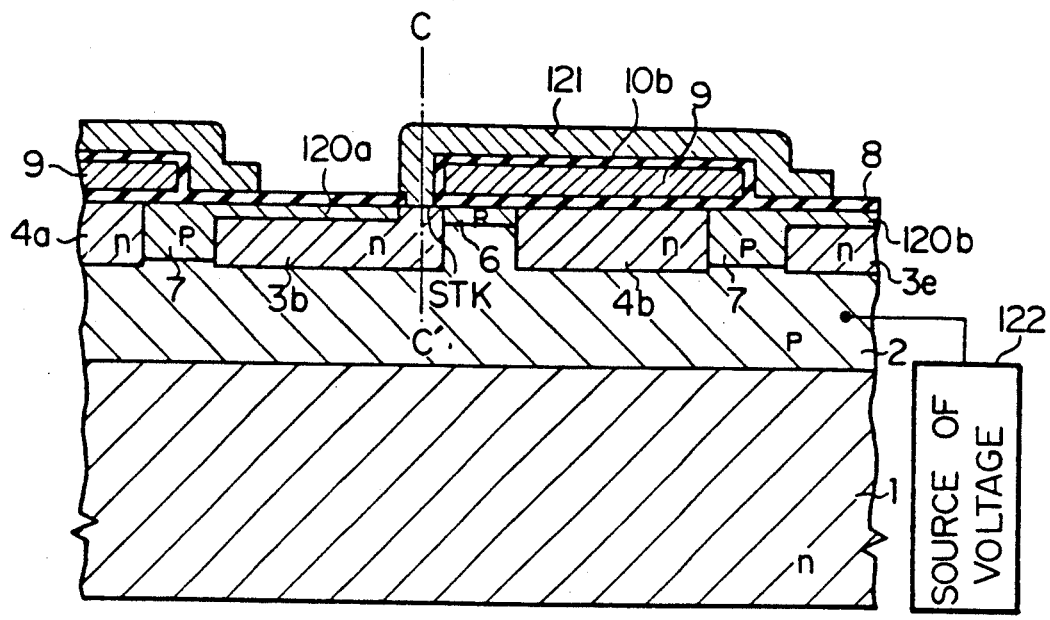
FIG. 13 is a cross sectional view showing the structure of still another solid state image pickup device according to the present invention.

Turning to FIG. 13 of the drawings, still another solid state image pickup device embodying the present invention is fabricated on an n-type semiconductor substrate 1. The solid state image pickup device shown in FIG. 13 is slightly different from the third embodiment. Namely, p-type spacer regions 120a and 120b are contiguous to the heavily doped p-type channel stopper region 7, and a photo-shield plate 121 is not brought into contact with the p-type contact regions 120a and 120b. Since the heavily doped channel stopper region 7 is in contact with the p-type well region 2, a predetermined voltage level is supplied from a source of voltage 122 through the p-type well region 2 and the channel stopper region 7 to the spacer regions 120a and 120b. The predetermined voltage level may be the ground voltage level.

Figure 14:
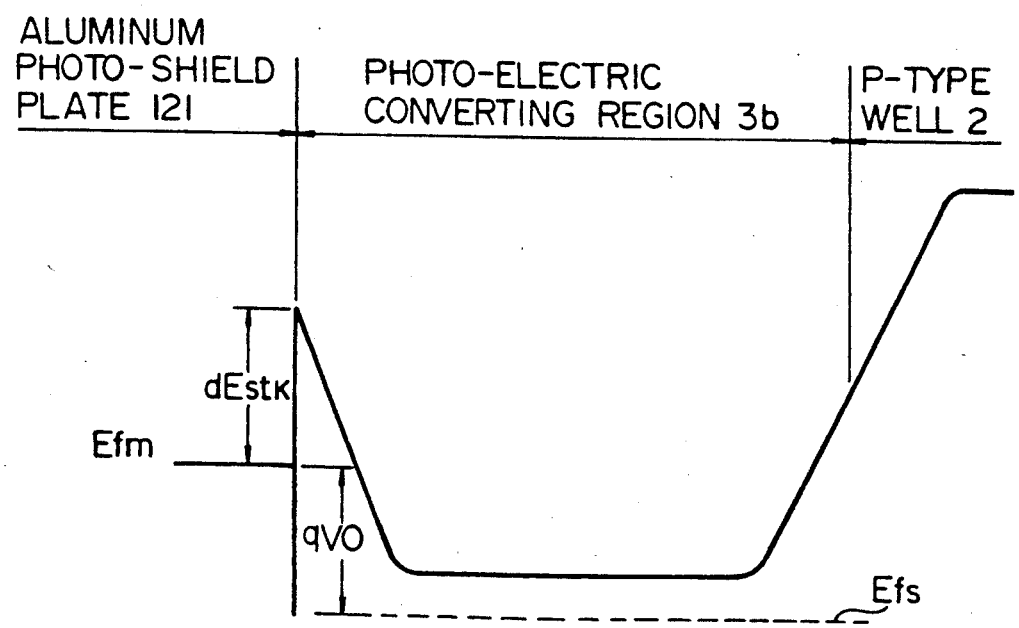
FIG. 14 is a diagram showing the bottom edge of a conduction band taken along line C-C' of FIG. 13.

The photo-shield plate 121 is directly brought into contact with the photo-electric converting regions, and, therefore, each contact window does not expose all the periphery of each photo-electric converting region as similar to the second embodiment. The bottom edge of a conduction band taken along line C-C' is illustrated in FIG. 14. The solid state image pickup device shown in FIG. 13 behaves as similar to the first embodiment in both operational sequences, and no repetition is made hereinbelow for the sake of simplicity.

As will be understood from the foregoing description, the solid state image pickup device according to the present invention effectively sweeps excess electric charges into the aluminum photo-shield plate via Schottky barrier and, for this reason, is free from the blooming phenomenon. Moreover, since the amount of electric charges to be accumulated in each photo-electric converting region is controllable by changing the potential level at the photo-shield plate, no delicate process control is necessary for formation of the p-type well region, and, therefore, the production yield is improved. If an electronic shutter mode of operation is requested, it is easily achieved by changing the voltage level at the photo-shield plate, and the solid state image pickup device is operable in a variable electronic mode of operation.

Although particular embodiments of the present invention have been shown and described, it will be obvious to those skilled in the art that various changes and modifications may be made without departing from the spirit and scope of the present invention. In the above described embodiments, the charge transferring regions are respectively associated with the columns of the photo-electric converting regions; however, the word "columns" are replaceable with word "rows" because the difference is merely an orientation. Moreover, the photo-shield plate may be formed of another metal or alloy for forming an appropriate Schottky barrier, and platinum is one of the candidates for the material used for the photo-shield plate. Furthermore, although area image pickup devices are employed for explanation of the present invention through the embodiments, the present invention may be similarly applicable to linear image pickup devices having a single line of the photoelectric converting regions.

What is claimed is:

1. A solid state image pickup device fabricated on a semiconductor substrate of a first conductivity type, comprising:

a) a well having a second conductivity type opposite to said first conductivity type and formed in a surface portion of said semiconductor substrate;

b) a plurality of photo-electric converting regions of said first conductivity type arranged in rows and columns and converting parts of an optical radiation into electric charges, respectively;

c) a plurality of charge transferring regions of said first conductivity type associated with the columns of said photo-electric converting regions, respectively, and conveying said electric charges, each of said charge transferring regions being spaced apart from the associated column of said photo-electric converting regions by a channel forming region;

d) charge transferring means provided over said charge transferring regions and allowing said charge transferring regions to convey said electric charges; and e) a metallic photo-shield plate preventing said charge transferring regions each being contiguous to said channel forming region from said optical radiation and exposing said photo-electric converting regions to the parts of said optical radiation, in which said metallic photo-shield plate is in contact with said photo-electric converting regions for forming Schottky barriers therebetween and in which excess electric charges overflow beyond said Schottky barrier into said metallic photo-shield plate.

2. A solid state image pickup device as set forth in claim 1, in which a p-n junction takes place between said well and each of said photo-electric converting regions and in which a built-in potential at said p-n junction is higher than said Schottky barrier in terms of said excess electric charges.

3. A solid state image pickup device as set forth in claim 2, in which said solid state image pickup device selectively enters at least a charge accumulating mode of operation and an electronic shutter mode of operation.

4. A solid state image pickup device as set forth in claim 3, in which a potential well takes place between said Schottky barrier and said built-in potential in said charge accumulating mode of operation for accumulating signal charges and in which the bottom edge of said potential well exceeds said Schottky barrier in said electronic shutter mode of operation for sweeping ineffectual electric charges into said metallic photo-shield plate.

5. A solid state image pickup device as set forth in claim 4, in which said first and second conductivity types are imparted by n-type impurity atoms and p-type impurity atoms, respectively, and in which said metallic photoshield plate is negatively biased with respect to said photo-electric converting regions in said accumulating mode of operation and is positively biased with respect to said photo-electric converting regions in said electronic shutter mode of operation.

6. A solid state image pickup device as set forth in claim 5, in which said metallic photo-shield plate is formed of aluminum and in which a difference in voltage level between said metallic photo-shield plate and said photo-electric converting regions is of the order of 15 volts.

7. A solid state image pickup device as set forth in claim 2, in which said metallic photo-shield plate is in contact with each of said photo-electric converting regions along a periphery thereof.

8. A solid state image pickup device as set forth in claim 2, in which said metallic photo-shield plate contacts a part of a periphery of each photo-electric converting region.

9. A solid state image pickup device as set forth in claim 1, in which said solid state image pickup device further comprises a spacer region of said second conductivity type formed in each of said photo-electric converting regions and in which said metallic photo-shield plate is in contact with said spacer region for forming a Schottky barrier therebetween.

10. A solid state image pickup device as set forth in claim 1, in which a predetermined number of said photoelectric converting regions are associated with each of said charge transferring region and in which a channel stopper region of said second conductivity type is formed on both sides of a combination of said photo-electric converting regions and said associated charge transferring region, wherein said channel stopper is in contact with a spacer region formed in a surface portion of each photoelectric converting region, thereby propagating a voltage level of said well to said spacer region.

11. A solid state image pickup device formed on a semiconductor substrate, comprising:
    a) a plurality of photo-electric converting regions formed on said semiconductor substrate and arranged in a line, said photoelectric converting regions converting irradiated radiation into electric charges and storing said converted electric charges;
    b) a charge transfer region formed on said semiconductor substrate in parallel to said line of photo-electric converting regions, said charge transfer region having a plurality of transfer stages through which electric charges received from said photo-electric converting regions are transferred;
    c) a means provided over said semiconductor substrate between said photo-electric converting regions and said charge transfer region for intermittently supplying said electric charges stored in said photo-electric converting regions to said transfer stages, respectively; and
    d) a metallic photo-shield layer covering said charge transfer region and said means and contacting said photoelectric converting regions through an insulating material to form a Schottky barrier therebetween.

12. A solid state image pickup device as set forth in claim 1, wherein said semiconductor substrate has a first conductivity type and has a well region of a second conductivity type opposite to said first conductivity type, said photo-electric converting regions being of regions formed in said well regions with said first conductivity type and said charge transfer region having a channel region formed in said well region with said first conductivity type.

13. A solid state image pickup device as set forth in claim 11, wherein said metallic photo-shield layer is made of aluminum.

* * * * *